(12) United States Patent
Kwon (10) Patent No.: US 6,914,461 B2
(45) Date of Patent: Jul. 5, 2005

(54) POWER-ON RESET CIRCUITS INCLUDING FIRST AND SECOND SIGNAL GENERATORS AND RELATED METHODS

(75) Inventor: Kee-Won Kwon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/402,641

(22) Filed: Mar. 28, 2003

(65) Prior Publication Data

US 2004/0036514 A1 Feb. 26, 2004

(30) Foreign Application Priority Data

Aug. 20, 2002 (KR) .................................. 10-2002-0049136

(51) Int. Cl.[7] .......................... H03K 17/22; H03K 17/30
(52) U.S. Cl. ...................................... 327/143; 327/198
(58) Field of Search .............................. 327/142, 143, 327/198; 323/901

(56) References Cited

U.S. PATENT DOCUMENTS

| | | | | | |
|---|---|---|---|---|---|
| 4,142,118 | A | * | 2/1979 | Guritz | 327/72 |
| 5,144,159 | A | * | 9/1992 | Frisch et al. | 327/198 |
| 5,323,067 | A | * | 6/1994 | Shay | 327/142 |
| 5,519,347 | A | * | 5/1996 | Kim | 327/143 |
| 6,160,429 | A | * | 12/2000 | Morrill | 327/143 |
| 6,229,352 | B1 | * | 5/2001 | Chevallier et al. | 327/77 |
| 6,236,249 | B1 | * | 5/2001 | Choi et al. | 327/143 |

FOREIGN PATENT DOCUMENTS

| | | | | |
|---|---|---|---|---|
| JP | 11-031956 | 2/1999 | .......... | H03K/17/22 |
| KR | 1999-0009451 | 2/1999 | .......... | H03K/17/22 |

OTHER PUBLICATIONS

Notice to File Response for corresponding Korean Application No. 2002–49136 dated Jul. 31, 2004 (English Translation).

* cited by examiner

Primary Examiner—Timothy P. Callahan
Assistant Examiner—Terry L. Englund
(74) Attorney, Agent, or Firm—Myers Bigel Sibley & Sajovec (57) ABSTRACT

A power-on reset circuit which outputs a power-on reset signal through an output node includes a first signal generator that generates a first signal voltage. The first signal voltage increases from a ground voltage when a power supply voltage reaches a first threshold voltage. A second signal generator generates a second signal voltage, and the second signal voltage decreases from the power supply voltage when the power supply voltage reaches a second threshold voltage. A comparator activates the power-on reset signal responsive to a comparison of the first and second signals.

35 Claims, 7 Drawing Sheets

POWER-ON RESET CIRCUITS INCLUDING FIRST AND SECOND SIGNAL GENERATORS AND RELATED METHODS

RELATED APPLICATION

This application claims the benefit of Korean Patent Application No. 2002-0049136, filed Aug. 20, 2002, the disclosure of which is hereby incorporated by reference in its entirety as if set forth fully herein.

1. Field of the Invention

The present invention relates to semiconductor integrated circuit devices, and in particular to power-on reset circuits and methods.

2. Background of the Invention

When a power supply voltage for application to internal circuits in an integrated semiconductor device is turned on, the voltage typically increases for a period of time. However, the power supply voltage may be unstable below a certain threshold voltage level. When the power supply voltage is below the threshold voltage level and as it increases, short circuits or standby current may be generated in the internal circuits (e.g., CMOS circuits) of the integrated semiconductor circuit device.

In order to reduce short circuit currents, generally, a circuit has been developed that disables internal circuits until the power supply voltage becomes stable. Such a circuit is typically referred to as a "power-on reset circuit." Accordingly, the power-on reset circuit may be used to reduce application of an unstable power supply voltage from being applied to internal circuits. That is, when a power supply voltage is below a predetermined voltage, the voltage is not supplied to internal circuits. When the power supply voltage is over the predetermined voltage, it is supplied to the internal circuits. Such power-on reset circuits may have undesirable temperature dependant characteristics.

Figure 1:
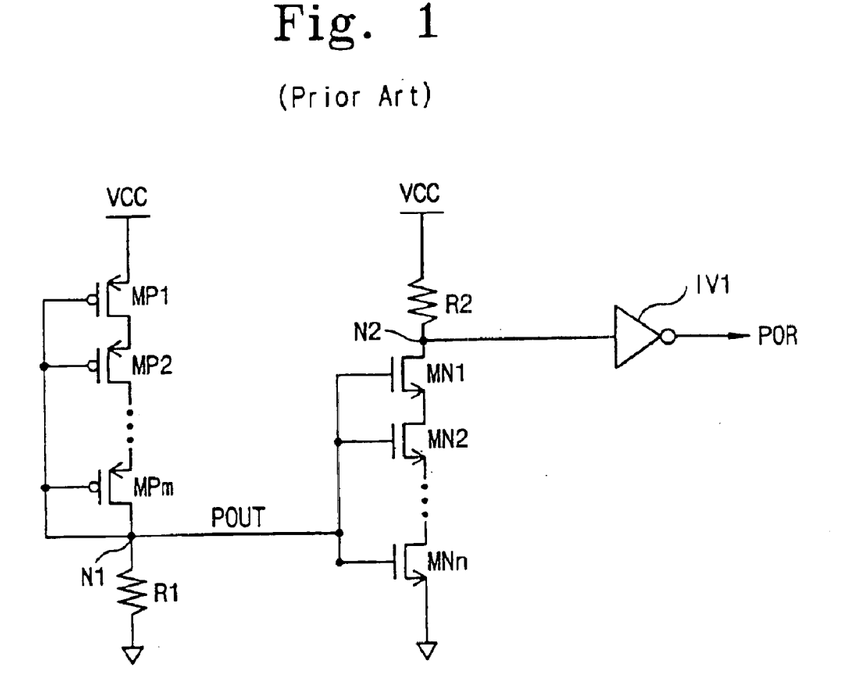
FIG. 1 is a circuit diagram of a conventional power-on reset circuit.

FIG. 1 is an example of a conventional power-on reset circuit. The illustrated conventional power-on reset circuit includes a plurality of PMOS transistors MP1–MPm connected in series between a power supply voltage VCC and a node N1; a resistor R1 connected between the node N1 and a ground voltage; a resistor R2 connected between the power supply voltage VCC and a node N2; a plurality of NMOS transistors MN1–MNn connected in series between the node N2 and the ground voltage; and an inverter IV1 connected to the node N2 to output a power-on reset signal POR. Gates of the PMOS transistors MP1–MPm are connected commonly to the node N1, and gates of the NMOS transistors MN1–MNn are connected commonly to the node N1.

Figure 2:
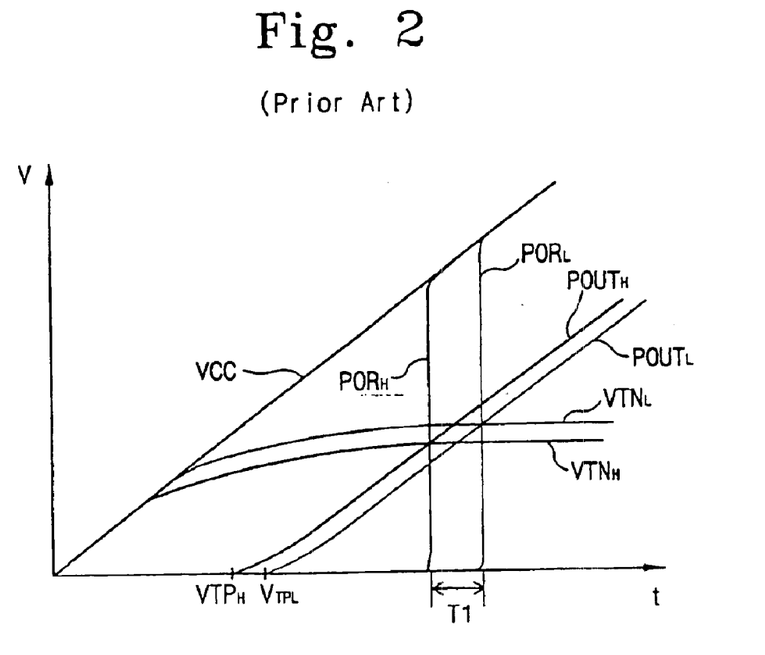
FIG. 2 is graph illustrating voltage as a function of time for signals from the conventional power-on reset circuit of FIG. 1.

FIG. 2 shows waveforms of signals used in FIG. 1. In FIG. 2, the subscript "H" is used to indicate a relatively higher peripheral temperature. Therefore, signals $POR_H$, $POUT_H$, and $VTN_H$ are signals obtained when the peripheral temperature is relatively high. The subscript "L" indicates that the peripheral temperature is relatively lower, and thus signals $POR_L$, $POUT_L$, and $VTN_L$ are signals obtained when the peripheral temperature is relatively lower. Thus, low-temperature and high-temperature characteristics of the conventional power-on reset circuit are described with reference to FIGS. 1 and 2.

When power is on and the power supply voltage VCC is lower in level than a threshold voltage $VTP_L$ of a PMOS transistor, the signal voltage $POUT_L$ of the node N1 is ground voltage. When the power supply voltage VCC is equal to or higher than the threshold voltage $VTP_L$ thereof, the signal voltage $POUT_L$ of the node N1 is increased in proportion to increasing of the power supply voltage VCC. A voltage difference between the power supply voltage VCC and the signal voltage $POUT_L$ is equal to the threshold voltage $VTP_L$ of a PMOS transistor.

When the signal voltage $POUT_L$ of the node N1 becomes higher than a sum $VTN_L$ of threshold voltages of NMOS transistors MN1–MNn, the NMOS transistors MN1–MNn are turned on. As the transistors MN1–MNn are turned on, an inverter IV1 outputs a power-on reset signal $POR_L$ that has a logic high level.

When the peripheral temperature rises relative to a peripheral temperature that is relatively lower, the threshold voltage $VTP_H$ of the PMOS transistor is lowered. This results in a signal voltage $POUT_H$ of the node N1 that is higher compared to $POUT_L$. On the other hand, when the peripheral temperature is relatively high, the threshold voltage $VTN_H$ of the NMOS transistor is lowered. The NMOS transistors MN1–MNn are turned on more rapidly than when the peripheral temperature is relatively lower. Thus, the activation point of time of the power-on reset signal $POR_H$ is reached more quickly by T1 than that of the power-on reset signal $POR_L$.

In order to reduce standby current, resistance values of the resistors R1 and R2 in the conventional power-on reset circuit may be very large. A transition point of time of a power-on reset signal POR is dependant on threshold voltages of the PMOS and NMOS transistors. As illustrated in FIG. 2, a transition point of time of the power-on reset signal POR is determined at an intersection where a signal voltage POUT on the node N1 conforms to a threshold voltage of the NMOS transistor. Compared with the transition point of time of the power-on reset signal $POR_L$, the transition point of time of the power-on reset signal $POR_H$ is reached more rapidly by T1. If a temperature becomes higher, the transition point of time of the power-on reset signal $POR_H$ is reached more rapidly. In some cases, the power-on reset signal may be activated before the power supply voltage VCC has reached a voltage sufficient to operate the internal circuits normally.

SUMMARY OF THE INVENTION

Embodiments of the present invention provide power-on reset circuits. A first signal generator is configured to generate a first signal voltage responsive to an increasing power supply voltage. The first signal voltage increases from a ground voltage after the power supply voltage increases above a first threshold voltage. A second signal generator is configured to generate a second signal voltage responsive to the increasing power supply voltage. The second signal voltage increases with the power supply voltage until the power supply voltage increases above a second threshold voltage and then decreases as the power supply voltage continues to increase. A comparator is configured to activate a power-on reset signal responsive to a comparison of the first and second signal voltages.

In certain embodiments, a control circuit includes a power-on reset circuit configured to activate a power-on reset signal responsive to a rising power supply voltage. A latch is configured to latch the activated power-on reset signal responsive to activation of the power-on reset signal. A disable circuit is configured to disable the power-on reset circuit responsive to activation of the power-on reset signal.

Further embodiments of the present invention provide power-on reset circuits which generates a power-on reset signal. The power-on reset circuit includes a first signal generator that generates a first signal voltage. The first signal voltage increases from a ground voltage when a power supply voltage reaches a first threshold voltage. A second signal generator generates a second signal voltage, and the second signal voltage decreases from the power supply voltage when the power supply voltage reaches a second threshold voltage. A comparator activates the power-on reset signal responsive to a comparison of the first and second signal voltages.

According to other embodiments of the present invention, a power-on reset circuit which outputs a power-on reset signal through an output node includes a comparator having a non-inverting input terminal, an inverting input terminal, and an output terminal connected to the output node. A first threshold device is connected between a power supply voltage and the non-inverting input terminal of the comparator. The first threshold device increases a voltage applied to the non-inverting terminal when the power supply voltage is higher than a first threshold voltage. A second threshold device is connected to the non-inverting input terminal of the comparator. The second threshold device increases a voltage rising rate of the non-inverting input terminal when the a voltage of the non-inverting terminal reaches a second threshold voltage. A voltage increasing device is connected between the power supply voltage and the inverting input terminal of the comparator. The voltage increasing device increases a voltage of the inverting input terminal according to increasing of the power supply voltage. A third threshold device is connected to the inverting input terminal of the comparator. The third threshold device inverts a voltage rising rate of the inverting input terminal when a voltage of the inverting input terminal reaches a third threshold voltage.

In further embodiments according to the present invention, a power-on reset circuit which outputs a power-on reset signal, includes a first signal generator that generates a first signal voltage. The first signal voltage increases from a ground voltage when a power supply voltage reaches a first threshold voltage. A second signal generator generates a second signal voltage. The second signal voltage decreases from the power supply voltage when the power supply voltage reaches a second threshold voltage. A comparator activates a compare signal when the first signal voltage is higher than the second signal voltage. A disable circuit activates the power-on reset signal and disables the first and second signal generators and the comparator in response to activation of the compare signal.

In further embodiments according to the present invention, methods of generating a power-on reset signal are provided. A first signal is generated responsive to an increasing power supply voltage. The first signal voltage increases from a ground voltage after the power supply voltage increases above a first threshold voltage. A second signal voltage is generated responsive to the increasing power supply voltage. The second signal voltage increases with the power supply voltage until the power supply voltage increases above a second threshold voltage and then decreases as the power supply voltage continues to increase. The power-on reset signal is activated responsive to a comparison of the first and second signal voltages.

In still further embodiments, methods for generating a power-on reset signal include activating a power-on reset signal responsive to a rising power supply voltage. The activated power-on reset signal is latched responsive to activation of the power-on reset signal. The power-on reset signal is disable activated responsive to activation of the power-on reset signal.

DESCRIPTION OF THE PREFERRED EMBODIMENT

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Terms used herein are to be given their ordinary meaning unless explicitly defined otherwise herein.

Figure 3:
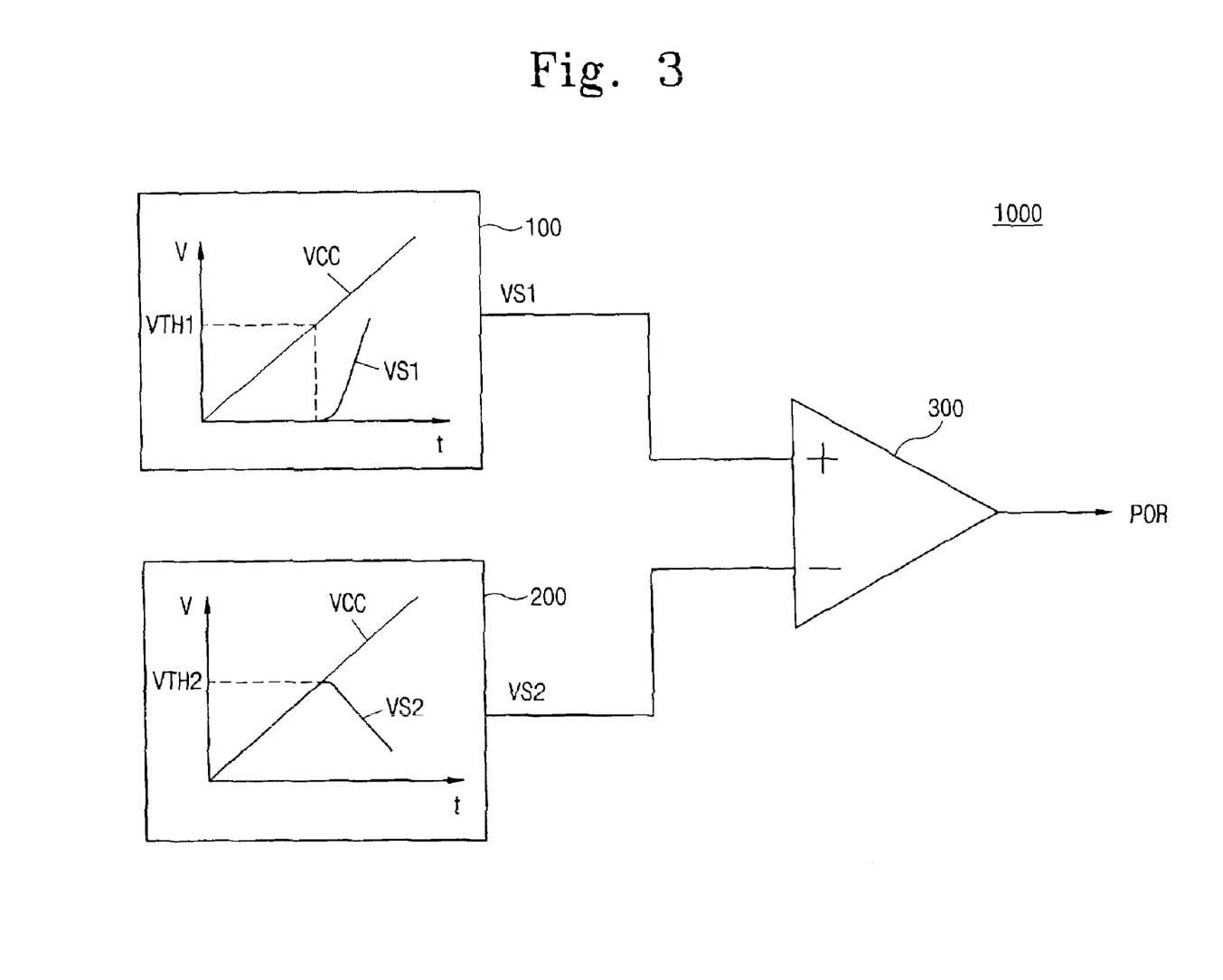
FIG. 3 is a block diagram of power-on reset circuits according to embodiments of the present invention.

FIG. 3 shows a block diagram of a power-on reset circuit according to embodiments of the present invention. A power-on reset circuit 1000 includes a first signal generator 100, a second signal generator 200, and a comparator 300. The first signal generator 100 generates the first signal voltage VS1 in response to a power supply voltage VCC. As illustrated in FIG. 3, the first signal voltage VS1 is equal to a ground voltage in the region where the power supply voltage VCC is lower than the first threshold voltage VTH1. However, in the region where the power supply voltage VCC is higher than the first threshold voltage VTH1, the first signal voltage VS1 increases from ground voltage, and has a slope that is greater than that of the power supply voltage VCC.

The second signal generator 200 generates a second signal voltage VS2 in response to the power supply voltage VCC. The second signal voltage VS2 follows the power supply voltage VCC in the region where the power supply voltage VCC is lower than the second threshold voltage VTH2. When the power supply voltage VS2 reaches the second threshold voltage VTH2, the second signal voltage VS2 decreases with a predetermined slope.

The comparator 300 receives the first and second signal voltages VS1 and VS2 and activates a power-on reset signal POR to high when the first signal voltage VS1 is higher than the second signal voltage VS2.

Figure 4:
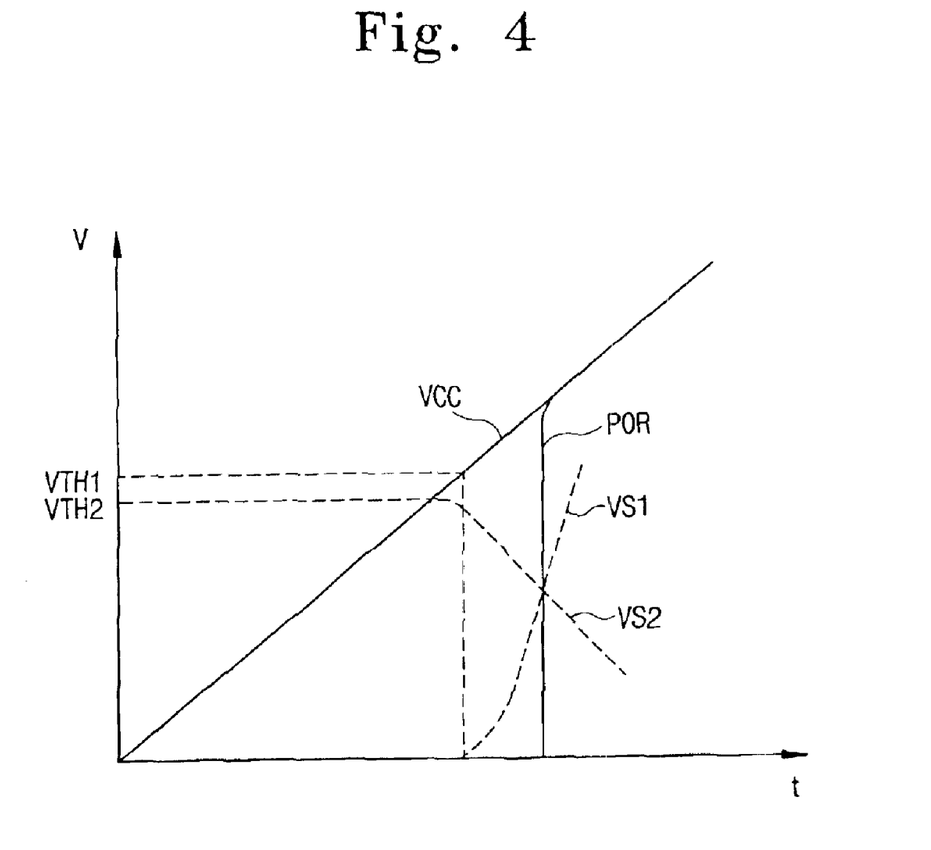
FIG. 4 is a timing diagram illustrating characteristics of power-on reset circuits of FIG. 3.

FIG. 4 illustrates operating characteristics of the power-on reset circuit signal from circuits illustrated in FIG. 3. The first signal voltage VS1 increases with a greater slope than that of a power supply voltage VCC when the power supply voltage VCC reaches the first threshold voltage VTH1. The second signal voltage VS2 follows the power supply voltage VCC in the region where the second signal voltage VS2 is lower than the second threshold voltage VTH2. When the second signal voltage VS2 is higher than the second threshold voltage VTH2, the power supply voltage VCC decreases with a predetermined slope. The power-on reset signal POR is activated high when the first signal voltage VS1 is higher than the second signal voltage VS2. The first and second threshold voltages VTH1 and VTH2 can be modified, for example, by adjusting the number of transistors in the first and second signal generators 100 and 200. Therefore, the activation point of time for the power-on reset signal POR can be adjusted.

Operating characteristics of certain power-on reset circuits according to embodiments of the present invention may result in a range of power-on reset signal transition points of time that may be relatively narrow despite a varied range of temperatures.

Figure 5:
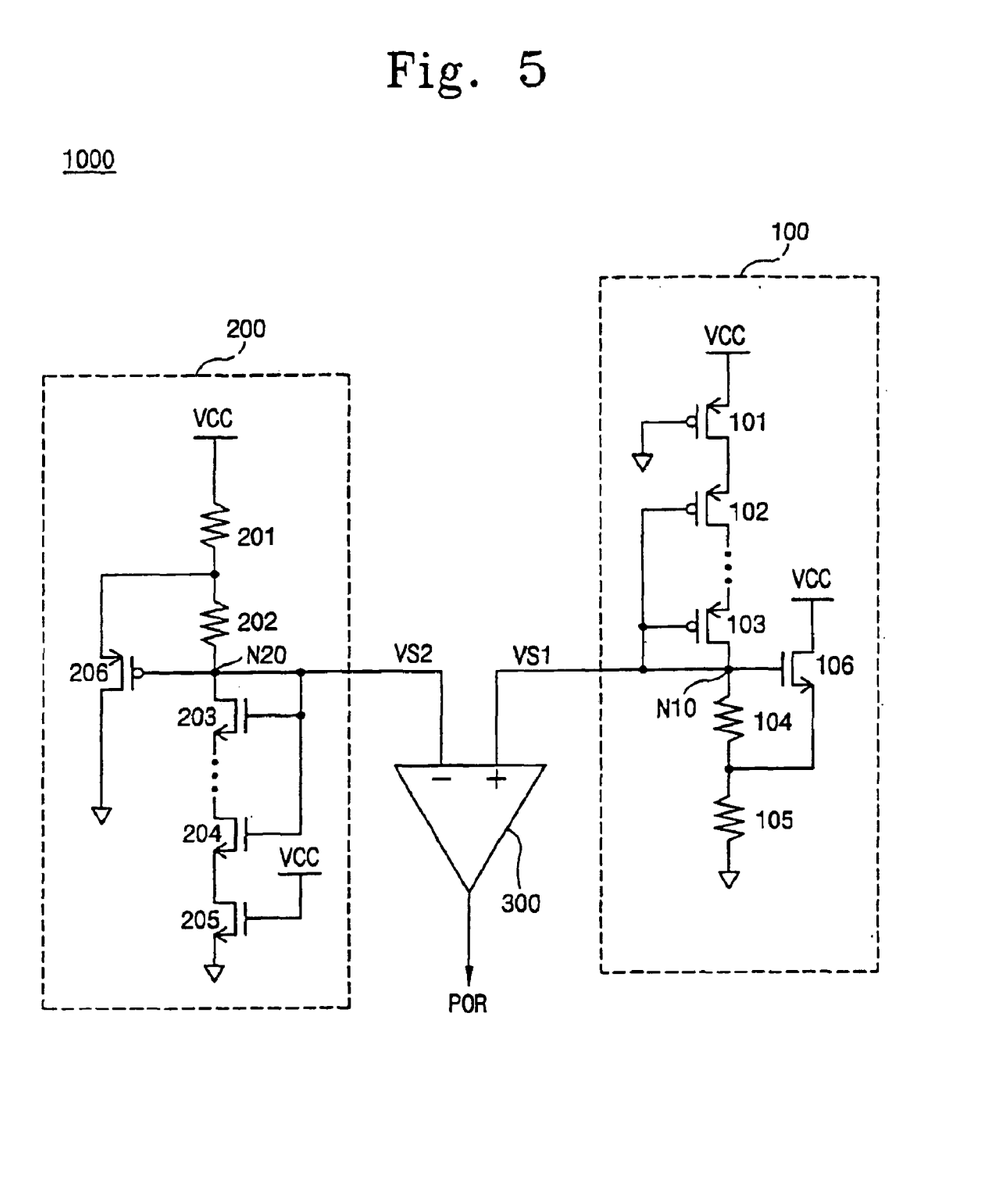
FIG. 5 is a circuit diagram of power-on reset circuits according to further embodiments of the present invention.

FIG. 5 shows embodiments of first and second signal generators illustrated in FIG. 3 according to the present invention. Referring to FIG. 5, the first signal generator 100 includes a plurality of PMOS transistors 101–103, two resistors 104 and 105, and an NMOS transistor 106. The PMOS transistors 101–103 are connected in series between a power supply voltage VCC and a node N10. A gate of the PMOS transistor 101 is grounded, and gates of the remaining PMOS transistors 102–103 are connected in common to the node N10. The resistors 104 and 105 are connected in series between the node N10 and a ground voltage. The NMOS transistor 106 has a gate that is connected to the node N10, and a current path formed between the power supply voltage VCC and an interconnection of the resistors 104 and 105. The first threshold voltage VTH1 is the threshold voltage of the PMOS transistors 101–103.

As would be understood by those of skill in the art, threshold voltage of a PMOS transistor can be varied by a body effect. That is, as the source voltage of the PMOS transistor is decreased, its threshold voltage may increase. Accordingly, the first threshold voltage VTH1 may be either a threshold voltage of a PMOS transistor when the body effect is not considered or a threshold voltage of a PMOS transistor when the body effect is considered. In this embodiment, the first threshold voltage VTH1 is a threshold voltage of a PMOS transistor when a body effect is not considered.

The second signal generator 200 includes two resistors 201 and 202, a plurality of NMOS transistors 203–205, and a PMOS transistor 206. The resistors 201 and 202 are connected in series between the power supply voltage VCC and a node N20, and the NMOS transistors 203–205 are connected in series between the node N20 and the ground voltage. Gates of the transistors 203–204 are connected in common to the node N20, and the gate of the transistor 205 is connected to the power supply voltage VCC. The PMOS transistor 206 has a gate that is connected to the node N20 and a current path formed between an interconnection of the resistors 201 and 202 and the ground voltage. The second threshold voltage VTH2 is the voltage needed for turning on the NMOS transistors 203–204.

The comparator 300 has a non-inverting input terminal connected to receive the first signal voltage VS1, an inverting input terminal connected to receive the second signal voltage VS2, and an output terminal for outputting a power-on reset signal POR.

An operation of the power-on reset circuit illustrated in FIG. 5 will be fully described below. After power is supplied, the power supply voltage VCC starts to increase. The first signal voltage VS1 is maintained at a ground voltage until the power supply voltage VCC reaches the first threshold voltage VTH1. The first signal voltage VS1 increases with a greater slope than the power supply voltage VCC when the power supply voltage VCC is equal to or higher than the first threshold voltage VTH1. If the first signal voltage VS1 is higher than the threshold voltage of the NMOS transistor 106, the NMOS transistor 106 is turned on. When the NMOS transistor 106 is turned on, the voltage at the interconnection of resistors 104 and 105 is increased (resulting in a more rapid increase of the first signal voltage VS1), and the first signal voltage VS1 around the ground voltage is increased more rapidly than the power supply voltage VCC. Meanwhile, the second signal voltage VS2 connected to the power supply voltage VCC through resistors 201 and 202 follows the power supply voltage VCC. In the region where the second signal voltage VS2 is higher than the second threshold voltage VTH2, NMOS transistors 203–204 in the second signal generator 200 are turned on. As the transistors 203–204 are turned on, the second signal voltage VS2 decreases toward the ground voltage. The PMOS transistor 206 is turned on when the second signal voltage VS2 decreases to a voltage sufficient to turn on the PMOS transistor 206. After the PMOS transistor 206 is turned on, the second signal voltage VS2 does not increase even though the power supply voltage VCC may continues to increase.

According to embodiments of the present invention if the temperature to which the power-on reset circuit is exposed varies, the first and second threshold voltages VTH1–VTH2 may also vary. For example, when a temperature becomes higher, the threshold voltages VTH1–VTH2 are lowered. This results in a faster activation time of the power-on reset signal POR. Although the first and second threshold voltages VTH1–VTH2 may vary according to temperature variation, the transition point of time where the first signal voltage VS1 crosses the second signal voltage VS2 may have less variation than that of the conventional power-on reset circuit.

Figure 6:
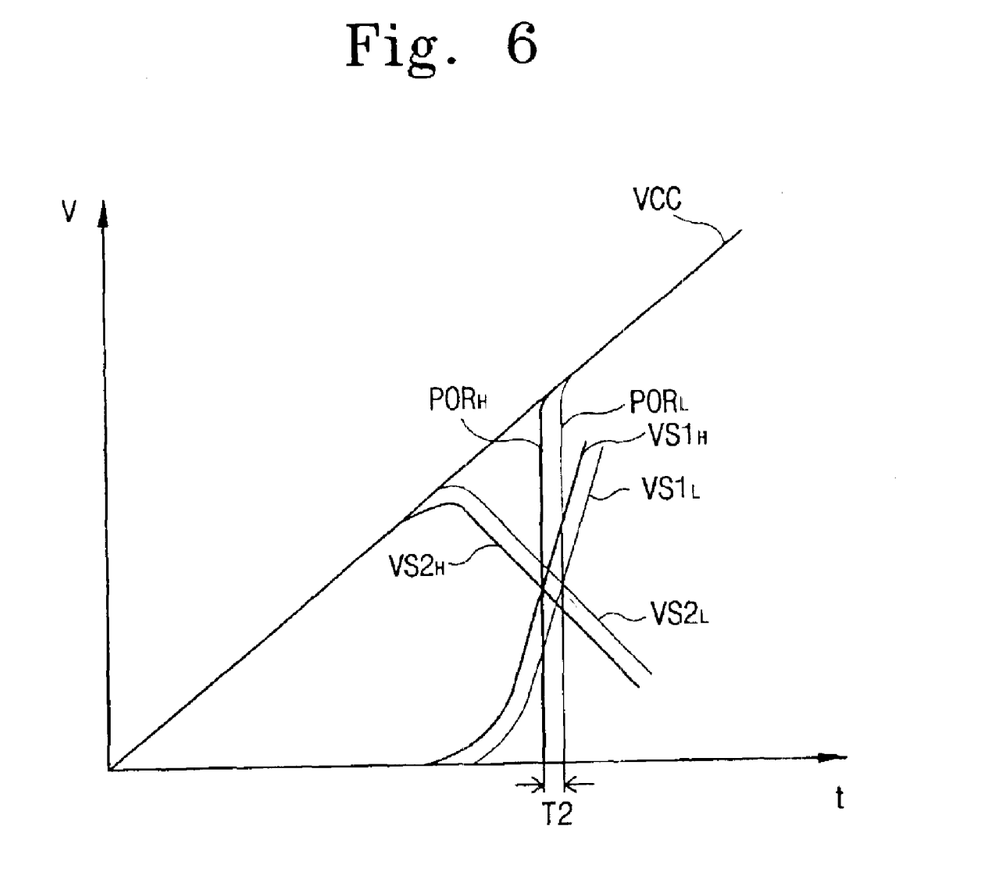
FIG. 6 is a graph illustrating voltage as a function of time for signals from power-on reset circuits of FIG. 5 in accordance with a temperature variation.

Referring to FIG. 6, signals $POR_L$, $VS1_L$, and $VS2_L$ are generated when the temperature is relatively lower, and signals $POR_H$, $VS1_H$, and $VS2_H$ are generated when the temperature is relative higher. Although the first and second threshold voltages VTH1–VTH2 vary due to variation of temperature, as illustrated in FIG. 6, the difference T2 between activation points of time of power-on reset signals $POR_L$ and $POR_H$ may be reduced compared with the difference T1 of the conventional power-on reset circuit (FIG. 2). The difference T2 may be reduced because the first signal voltage VS1 increases with a greater slope than the power supply voltage VCC and crosses the second signal voltage VS2, which may decrease with a greater slope than the power supply voltage VCC. Accordingly, embodiments of power-on reset circuits according to the present invention may have characteristics that can be less sensitive to temperature.

Figure 7:
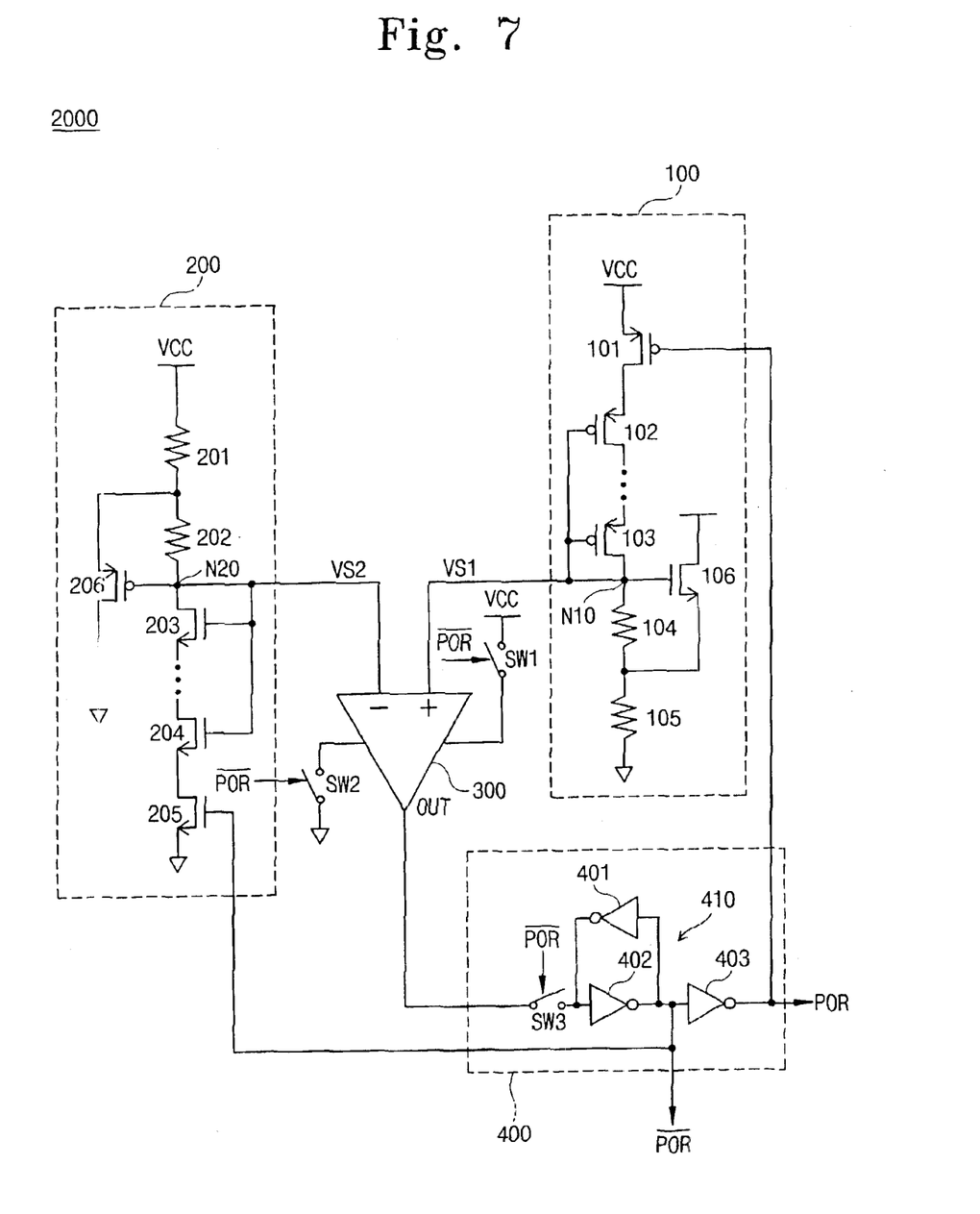
FIG. 7 is a circuit diagram of power-on reset circuits according to embodiments of the present invention.

FIG. 7 is another embodiment of a power-on reset circuit according to the present invention. In FIG. 7, constituent elements which are substantially identical to those in FIG. 5 are marked by the same reference numerals, and description thereof will be thus omitted.

Referring to FIG. 7, a power-on reset circuit 2000 further comprises switches SW1 and SW2 and a controller 400. The controller 400 forms a disable circuit and includes a switch SW3, a latch 410 formed of two inverters 401 and 402, and an inverter 403. The switch SW3 transfers an output signal OUT of the comparator 300 to the latch 410 in response to an inverted version of a power-on reset signal/POR (hereinafter, referred to as an "inverted power-on reset signal"). The inverter 403 receives an output/POR of the latch 410 to output a power-on reset signal POR.

The PMOS transistor 101 in the first signal generator 100 is controlled by the power-on reset signal POR from the controller 400, and the NMOS transistor 205 is controlled by the inverted power-on reset signal/POR from the controller 400. The switches SW1 and SW2 are controlled by the inverted power-on reset signal/POR. That is, when the switches SW1 and SW2 are activated, the comparator 300 is supplied with a power supply voltage VCC and a ground voltage. When the switches SW1 and SW2 are inactivated, the power supply voltage VCC and the ground voltage are not supplied to the comparator 300.

Initially, the inverted power-on reset signal/POR from the latch 410 is at a logic high level. This enables the power supply voltage VCC and the ground voltage to be supplied to the comparator 300 through the switches SW1 and SW2. When the power supply voltage VCC increases, and the first signal voltage VS1 is higher than the second signal voltage VS2, the output signal OUT of the comparator 300 is activated high. The output signal OUT is latched in the latch 410 through the switch SW3. At this time, the inverted power-on reset signal/POR transitions from a logic high level to a logic low level, so that the NMOS transistor 205 in the second signal generator 200 and the switches SW1 and SW2 are inactivated. At the same time, the power-on reset signal POR transitions from a logic low level to a logic high level, so that the PMOS transistor 101 in the first signal generator 100 is inactivated.

Thus, embodiments according to the present invention may be capable of reducing current consumed by the first and second signal generators 100 and 200 and the comparator 300 after a power-on reset signal POR transitions to high. Although the first and second signal generators 100 and 200 and the comparator 300 are disabled, the detection result (that is, an output signal of the comparator 300) is latched in the latch 410. Because of the disablement of the first and second signal generators 100 and 200 and the comparator 300, stable operation of power-on reset circuits according to embodiments of the present invention may be secured. The power-on reset signal POR may have reduced noise despite variation in the first and second signal voltages VS1 and VS2 due to noise.

Figure 8:
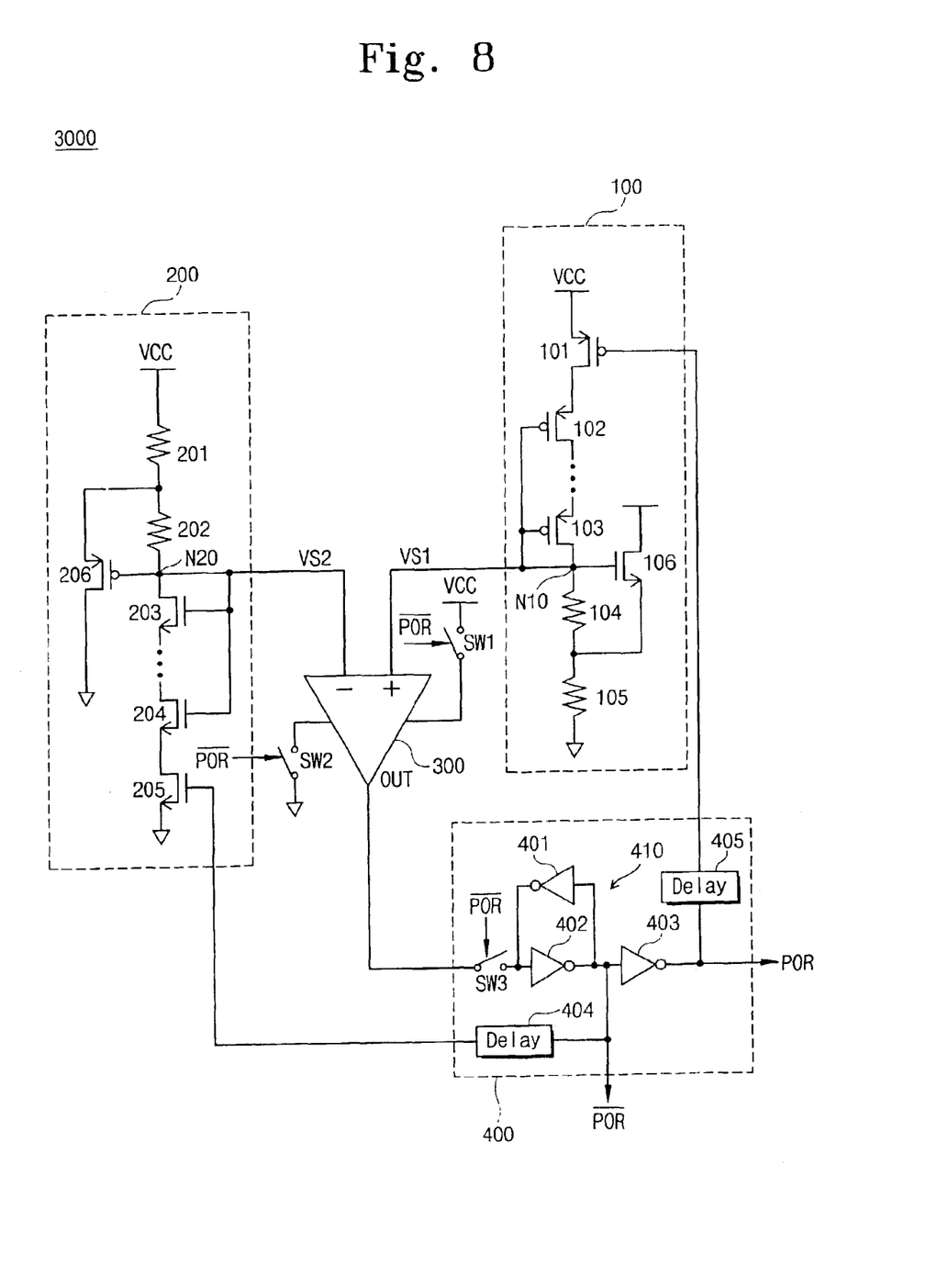
FIG. 8 illustrates a circuit diagram of power-on reset circuits according to other embodiments of the present invention.

FIG. 8 illustrates other embodiment of a power-on reset circuit according to the present invention. In FIG. 8, a power-on reset circuit 3000 is substantially identical to that in FIG. 7 except that delays 404 and 405 are added. The delays 404 and 405 may be used to ensure that an output signal OUT of a comparator 300 is stably latched in a latch 410.

In accordance with embodiments of the present invention, the temperature-insensitivity of power-on reset circuits may be increased. In some embodiments, power consumption of the power-on reset circuit can be reduced after activation of a power-on reset signal, by interrupting the power supply voltage to the power-on reset circuit. Furthermore, although internal voltages of the power-on reset circuit may fluctuate after activation of the power-on reset signal, the power-on reset signal may have reduced noise.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A power-on reset circuit comprising:
    a first signal generator configured to generate a first signal voltage responsive to an increasing power supply voltage, the first signal voltage increasing from a ground voltage after the power supply voltage increases above a first threshold voltage;
    a second signal generator configured to generate a second signal voltage responsive to the increasing power supply voltage, the second signal voltage increasing with the power supply voltage until the power supply voltage increases above a second threshold voltage and then decreasing as the power supply voltage continues to increase; and
    a comparator configured to activate a power-on reset signal responsive to a comparison of the first and second signal voltages.

2. A power-on reset circuit according to claim 1, wherein the first threshold voltage is greater than the second threshold voltage.

3. A power-on reset circuit according to claim 1, wherein the comparator comprises a first input terminal that receives the first signal voltage and a second input terminal that receives the second signal voltage.

4. A power-on reset circuit according to claim 3, wherein the first input terminal comprises a non-inverting input terminal and wherein the second input terminal comprises an inverting input terminal.

5. A power-on reset circuit according to claim 3, wherein the first signal generator comprises a plurality of PMOS transistors serially coupled between the power supply voltage and the first input terminal.

6. A power-on reset circuit according to claim 3, wherein the first signal generator comprises a plurality of resistors serially coupled between the first input terminal and ground.

7. A power-on reset circuit according to claim 6, wherein the first signal generator further comprises an NMOS transistor having a gate coupled to the first input terminal, having a first source/drain coupled to the power supply voltage, and having a second source/drain coupled to an interconnection of two of the resistors serially coupled between the first input terminal and ground.

8. A power-on reset circuit according to claim 3, wherein the second signal generator comprises a plurality of NMOS transistors serially coupled between the second input terminal and ground.

9. A power-on reset circuit according to claim 3, wherein the second signal generator comprises a plurality of resistors serially coupled between the power supply voltage and the second input terminal.

10. A power-on reset circuit according to claim 9, wherein the second signal generator further comprises a PMOS transistor having a gate coupled to the second input terminal, having a first source/drain coupled to an interconnection of two of the resistors serially coupled between the power supply voltage and the second input terminal, and having a second source/drain coupled to ground.

11. A power-on reset circuit according to claim 1, further comprising:
    a disable circuit configured to disable the first and second signal generators responsive to activation of the power-on reset signal.

12. A power-on reset circuit according to claim 11, wherein the disable circuit is further configured to latch the activated power-on reset signal responsive to activation of the power-on reset signal.

13. A power-on reset circuit which generates a power-on reset signal, comprising:
   a first signal generator that generates a first signal voltage, the first signal voltage increasing from a ground voltage when a power supply voltage reaches a first threshold voltage;
   a second signal generator that generates a second signal voltage, the second signal voltage decreasing from the power supply voltage when the power supply voltage reaches a second threshold voltage; and
   a comparator that activates the power-on reset signal responsive to a comparison of the first and second signal voltages.

14. The power-on reset circuit according to claim 13, wherein the comparator activates the power-on reset signal when the first signal voltage is higher than the second signal voltage.

15. The power-on reset circuit according to claim 13, wherein the first signal voltage has a greater slope than the power supply voltage after the power supply voltage reaches the first threshold voltage.

16. The power-on reset circuit according to claim 13, wherein the comparator comprises a non-inverting input terminal that receives the first signal voltage, an inverting input terminal that receives the second signal voltage, and an output terminal that outputs the power-on reset signal.

17. A power-on reset circuit which outputs a power-on reset signal through an output node, comprising:
   a comparator having a non-inverting input terminal, an inverting input terminal, and an output terminal connected to the output node;
   a first threshold device connected between a power supply voltage and the non-inverting input terminal of the comparator, that increases a voltage applied to the non-inverting terminal when the power supply voltage is higher than a first threshold voltage;
   a second threshold device connected to the non-inverting input terminal of the comparator, that increases a voltage rising rate of the non-inverting input terminal when the a voltage of the non-inverting terminal reaches a second threshold voltage;
   a voltage increasing device connected between the power supply voltage and the inverting input terminal of the comparator, that increases a voltage of the inverting input terminal according to increasing of the power supply voltage; and
   a third threshold device connected to the inverting input terminal of the comparator, that inverts a voltage rising rate of the inverting input terminal when a voltage of the inverting input terminal reaches a third threshold voltage.

18. The power-on reset circuit according to claim 17, wherein the first threshold device comprises a plurality of PMOS transistors connected in series between the power supply voltage and the non-inverting input terminal of the comparator, gates of the PMOS transistors being connected in common to the non-inverting input terminal.

19. The power-on reset circuit according to claim 18, wherein the first threshold voltage is a threshold voltage of one of the PMOS transistors.

20. The power-on reset circuit according to claim 17, wherein the second threshold device comprises:

two resistors connected in series between the inverting input terminal of the comparator and a ground voltage; and
an NMOS transistor having a drain connected to the power supply voltage, a source connected to an interconnection of the resistors, and a gate connected to the non-inverting input terminal.

21. The power-on reset circuit according to claim 20, wherein the second threshold voltage is a threshold voltage of the NMOS transistor in the second threshold device.

22. The power-on reset circuit according to claim 17, wherein the voltage increasing device comprises two resistors connected in series between the power supply voltage and the inverting input terminal of the comparator.

23. The power-on reset circuit according to claim 22, wherein the third threshold device comprises:
   a plurality of NMOS transistors connected in series between the inverting input terminal of the comparator and a ground voltage, gates of the NMOS transistors being connected in common to the inverting input terminal; and
   a PMOS transistor having a source connected to an interconnection of the resistors, a grounded drain, and a gate connected to the inverting input terminal of the comparator.

24. The power-on reset circuit according to claim 17, wherein the third threshold voltage is a threshold voltage of an NMOS transistor.

25. The power-on reset circuit according to claim 17, wherein the first threshold device and the second threshold device together output a first signal at a first signal voltage, and the voltage increasing device and the third threshold device together output a second signal at a second signal voltage, the non-inverting input terminal of the comparator receives the first signal voltage and the inverting input terminal thereof receives the second signal voltage.

26. A power-on reset circuit which outputs a power-on reset signal through an output node, comprising:
   a first signal generator that generates a first signal voltage, the first signal voltage increasing from a ground voltage when a power supply voltage reaches a first threshold voltage;
   a second signal generator that generates a second signal voltage, the second signal voltage decreasing from the power supply voltage when the power supply voltage reaches a second threshold voltage;
   a comparator that activates a compare signal when the first signal voltage is higher than the second signal voltage; and
   a disable circuit that activates the power-on reset signal and disables the first and second signal generators and the comparator, in response to activation of the compare signal.

27. The power-on reset circuit according to claim 26, wherein the first signal voltage has a slope greater than the power supply voltage in a region where the power supply voltage is higher than the first threshold voltage.

28. The power-on reset circuit according to claim 26, wherein the disable circuit comprises:
   a latch that latches the compare signal from the comparator and outputs a disable signal;
   a first switch connected between the comparator and the latch, for transferring the compare signal to the latch in response to the disable signal; and
   an inverter for receiving the disable signal from the latch to output the power-on reset signal.

29. The power-on reset circuit according to claim 28, wherein the comparator has a non-inverting input terminal connected to receive the first signal voltage, an inverting input terminal connected to receive the second signal voltage, and an output terminal connected to output the compare signal.

30. The power-on reset circuit according to claim 29, further comprising:
   a second switch for supplying the power supply voltage to the comparator in response to the disable signal; and
   a third switch for supplying the ground voltage to the comparator in response to the disable signal.

31. The power-on reset circuit according to claim 30, wherein the first signal generator comprises:
   a first disable transistor having a source connected to the power supply voltage, a drain, and a gate connected to receive the power-on reset signal;
   a plurality of PMOS transistors connected in series between the drain of the first disable transistor and the non-inverting input terminal of the comparator, gates of the PMOS transistors being connected commonly to the non-inverting terminal of the comparator;
   a plurality of resistors connected between the non-inverting input terminal and the ground voltage; and
   an NMOS transistor connected between the power supply voltage and an interconnection of the resistors, a gate of the NMOS transistor being connected to the non-inverting input terminal of the comparator.

32. The power-on reset circuit according to claim 31, wherein the second signal generator comprises:
   a second plurality of resistors connected between the power supply voltage and the inverting input terminal of the comparator;
   a second disable transistor having a source connected to the ground voltage, a gate connected to receive the power-on reset signal, and a drain;
   a plurality of NMOS transistors connected in series between the inverting input terminal of the comparator and the drain of the second disable transistor, gates of the NMOS transistors being connected commonly to the inverting input terminal thereof; and
   a PMOS transistor connected between an interconnection of the second plurality of resistors and the ground voltage, a gate of the PMOS transistor being connected to the inverting input terminal thereof.

33. The power-on reset circuit according to claim 30, wherein the disable signal is activated when the compare signal from the comparator is activated.

34. The power-on reset circuit according to claim 32, further comprising a first delay that delays the disable signal and outputs the delayed disable signal to the second and third switches; and a second delay that delays the power-on reset signal and outputs the delayed power-on reset signal to the first and second disable transistors.

35. A method of generating a power-on reset signal, the method comprising:
   generating a first signal voltage responsive to an increasing power supply voltage, the first signal voltage increasing from a ground voltage after the power supply voltage increases above a first threshold voltage;
   generating a second signal voltage responsive to the increasing power supply voltage, the second signal voltage increasing with the power supply voltage until the power supply voltage increases above a second threshold voltage and then decreasing as the power supply voltage continues to increase; and
   activating the power-on reset signal responsive to a comparison of the first and second signal voltages.

* * * * *

UNITED STATES PATENT AND TRADEMARK OFFICE
CERTIFICATE OF CORRECTION

PATENT NO. : 6,914,461 B2
DATED : July 5, 2005
INVENTOR(S) : Kwon

It is certified that error appears in the above-identified patent and that said Letters Patent is hereby corrected as shown below:

Column 9,
Line 45, should read -- when the voltage of the non-inverting terminal --.

Column 10,
Line 1, should read -- two resistors connected in series between the non-inverting --.
Line 28, should read -- a PMOS transistor. --.

Signed and Sealed this

Fourth Day of October, 2005

JON W. DUDAS
*Director of the United States Patent and Trademark Office*